United States Patent
Kadyshevitch et al.

(10) Patent No.: US 7,473,911 B2
(45) Date of Patent: *Jan. 6, 2009

(54) SPECIMEN CURRENT MAPPER

(75) Inventors: Alexander Kadyshevitch, Modiin (IL); Dror Shemesh, Petach-Tikva (IL); Yaniv Brami, Matan (IL); Dmitry Shur, Holon (IL)

(73) Assignee: Applied Materials, Israel, Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 10/695,620

(22) Filed: Oct. 27, 2003

(65) Prior Publication Data

US 2004/0084622 A1     May 6, 2004

Related U.S. Application Data

(63) Continuation-in-part of application No. 10/434,977, filed on May 9, 2003, now Pat. No. 7,038,224, which is a continuation-in-part of application No. 10/209,087, filed on Jul. 30, 2002, now Pat. No. 7,078,690.

(51) Int. Cl.
*H01J 49/44* (2006.01)

(52) U.S. Cl. .......... 250/492.22; 324/751; 324/500; 324/501

(58) Field of Classification Search .......... 250/310, 250/311, 491.1, 492.1, 492.2, 492.21, 492.22; 324/500–501, 537, 522, 751
See application file for complete search history.

(56) References Cited

U.S. PATENT DOCUMENTS

| | | | |
|---|---|---|---|
| 4,578,279 A | 3/1986 | Zingher | |
| 4,902,964 A | 2/1990 | Szabela et al. | |
| 4,902,967 A | 2/1990 | Flesner et al. | |
| 5,150,185 A | 9/1992 | Yamada | |

(Continued)

FOREIGN PATENT DOCUMENTS

JP    11087451    3/1999

(Continued)

OTHER PUBLICATIONS

Yacobi et al., *Scanning Electron Microscopy* (Chapter 2), Micro Analysis of Solids, Plenum Press, New York, 1994.

(Continued)

*Primary Examiner*—David A. Vanore
(74) *Attorney, Agent, or Firm*—Tarek N. Fahmi

(57) ABSTRACT

A method for process monitoring includes receiving a sample having a first layer that is at least partly conductive and a second layer formed over the first layer, following production of contact openings in the second layer. A beam of charged particles is directed along a beam axis that deviates substantially in angle from a normal to a surface of the sample, so as to irradiate one or more of the contact openings in each of a plurality of locations distributed over at least a region of the sample. A specimen current flowing through the first layer is measured in response to irradiation of the one or more of the contact openings at each of the plurality of locations. A map of at least the region of the sample is created, indicating the specimen current measured in response to the irradiation at the plurality of the locations.

27 Claims, 8 Drawing Sheets

U.S. PATENT DOCUMENTS

| | | | |
|---|---|---|---|
| 5,637,186 | A | 6/1997 | Liu et al. |
| 5,736,863 | A | 4/1998 | Liu |
| 5,897,710 | A | 4/1999 | Sato et al. |
| 5,903,011 | A | 5/1999 | Hatanaka |
| 6,232,787 | B1 | 5/2001 | Lo et al. |
| 6,235,634 | B1 | 5/2001 | White et al. |
| 6,236,222 | B1 | 5/2001 | Sur, Jr. et al. |
| 6,407,386 | B1 | 6/2002 | Dotan et al. |
| 6,410,353 | B1 | 6/2002 | Tsai |
| 6,504,393 | B1 | 1/2003 | Lo et al. |
| 6,559,662 | B1 | 5/2003 | Yamada et al. |
| 6,614,244 | B2 | 9/2003 | Yamada et al. |
| 6,768,324 | B1* | 7/2004 | Yamada et al. .............. 324/751 |
| 6,897,440 | B1 | 5/2005 | Yamada |
| 7,038,224 | B2 | 5/2006 | Kadyshevitch et al. |
| 2001/0022345 | A1 | 9/2001 | Isimoto |
| 2002/0070738 | A1 | 6/2002 | Yamada |
| 2002/0093350 | A1 | 7/2002 | Yamada |
| 2002/0134936 | A1 | 9/2002 | Miyako et al. |
| 2003/0104639 | A1 | 6/2003 | Kikuchi et al. |

FOREIGN PATENT DOCUMENTS

| | | |
|---|---|---|
| JP | 2000174077 | 6/2000 |
| JP | 144155 | 5/2001 |
| JP | 2001338956 | 7/2001 |
| JP | 2002083849 | 3/2002 |
| JP | 2002231780 | 8/2002 |
| WO | WO 0180304 A2 | 10/2001 |
| WO | WO 03067653 A2 | 8/2003 |

OTHER PUBLICATIONS

Yamada et al., *An In-Line Process Monitoring Method Using Electron Beam Induced Substrate Current*, Microelectronics-Reliability, Mar. 2001, pp. 455-459.

International Search Report and Written Opinion for PCT/US2004/014450, Sep. 28, 2004.

Yacobi et al., "Microanalysis of Solids", 1994 Plenum Press, New York, Chapters 1, 2 & 4.

Model EKF-1000 Omnicron Nanotechnology GmbH, Taunusstein, Germany, Available at http://www.omnicron.de/products/ekf1000, 2002.

Yamada, Keizo, In-Line Contact and Via Hole Monitoring Method Used Electron-Beam-Induced Substrate Current (EB Scope), NEC Research and Development, Nippon Electric Ltd., Tokyo, Japan, vol. 41, No. 4, Oct. 2000, pp. 336-340, XP000967723, ISSN: 0547-051X.

Invitation to Pay Additional Fees, International Patent Application No. PCT/US03/03494, Applied Materials, Inc., Aug. 19, 2003.

International Search Report, International Patent Application No. PCT/US03/03494, Applied Materials, Inc., Nov. 28, 2003.

Written Opinion, International Patent Application No. PCT/US03/03494, Applied Materials, Inc., Applied Materials, Inc., Jan. 27, 2005.

International Preliminary Examination Report, International Patent Application No. PCT/US03/03494, Applied Materials, Inc., Aug. 19, 2003.

Office Action dated May 21, 2004, from U.S. Appl. No. 10/209,087, filed Jul. 30, 2002, 6 pages.

Response to Office Action filed Jul. 21, 2004, from U.S. Appl. No. 10/209,087, filed Jul. 30, 2002, 6 pages.

Office Action dated Oct. 19, 2004, from U.S. Appl. No. 10/209,087, filed Jul. 30, 2002, 4 pages.

Response to Office Action filed Nov. 22, 2004, from U.S. Appl. No. 10/209,087, filed Jul. 30, 2002, 5 pages.

Notice of Non-Compliant Amendment dated Dec. 23, 2004, from U.S. Appl. No. 10/209,087, filed Jul. 30, 2002 2 pages.

Response to Notice of Non-Compliant Amendment filed Feb. 1, 2005, from U.S. Appl. No. 10/209,087, filed Jul. 30, 2002, 6 pages.

Office Action dated Mar. 2, 2005, from U.S. Appl. No. 10/209,087, filed Jul. 30, 2002, 10 pages.

Response to Office Action filed Jun. 30, 2005, from U.S. Appl. No. 10/209,087, filed Jul. 30, 2002, 15 pages.

Office Action dated Nov. 4, 2004, from U.S. Appl. No. 10/434,977, filed May 9, 2003, 6 pages.

Response of Office Action filed Jan. 4, 2005, from U.S. Appl. No. 10/434,977, filed May 9, 2003), ), 15 pages.

Office Action dated May 25, 2006, from U.S. Appl. No. 11/051,339, filed Feb. 3, 2005, 8 pages.

Response to Office Action filed Sep. 25, 2006, from U.S. Appl. No. 11/051,339, filed Feb. 3, 2005, 10 pages.

Office Action dated Nov. 24, 2006, from U.S. Appl. No. 11/051,339, filed Feb. 3, 2005, 6 pages.

Response to Office Action filed Mar. 27, 2007, from U.S. Appl. No. 11/051,339, filed Feb. 3, 2005, 3 pages.

Office Action dated Jul. 16, 2007, from U.S. Appl. No. 11/051,339, filed Feb. 3, 2005, 6 pages.

Response to Office Action filed Oct. 2, 2007, from U.S. Appl. No. 11/051,339, filed Feb. 3, 2005, 15 pages.

Office Action dated Jun. 12, 2006, from U.S. Appl. No. 11/181,659, filed Jul. 13, 2005, 5 pages.

Response to Office Action filed Jul. 12, 2006, from U.S. Appl. No. 11/181,659, filed Jul. 13, 2005, 6 pages.

Office Action dated Aug. 16, 2006, from U.S. Appl. No. 11/181,659, filed Jul. 13, 2005, 8 pages.

Response to Office Action filed Nov. 16, 2006, from U.S. Appl. No. 11/181,659, filed Jul. 13, 2005, 6 pages.

Office Action dated Jan. 26, 2007, from U.S. Appl. No. 11/181,659, filed Jul. 13, 2005, 5 pages.

Response to Office Action filed Apr. 17, 2007, from U.S. Appl. No. 11/181,659, filed Jul. 13, 2005, 8 pages.

Office Action dated Dec. 13, 2007, from U.S. Appl. No. 11/779,224, filed Jul. 17, 2007, 5 pages.

Response to Office Action filed Mar. 13, 2007, from U.S. Appl. No. 11/779,224, filed Jul. 17, 2007, 5 pages.

Office Action dated May 16, 2008, from U.S. Appl. No. 11/779,224, filed Jul. 17, 2007, 6 pages.

Office Action dated Aug. 25, 2006, from Chinese Patent Application No. 03803196.5 (filed Feb. 14, 2003), 15 pages (translated).

Response to Office Action dated Nov. 29, 2006, from Chinese Patent Application No. 03803196.5 (filed Feb. 14, 2003), 8 pages.

Office Action dated Feb. 16, 2007, from Chinese Patent Application No. 03803196.5 (filed Feb. 14, 2003), 12 pages (translated).

Response to Office Action dated Apr. 12, 2007, from Chinese Patent Application No. 03803196.5 (filed Feb. 14, 2003), 2 pages.

Office Action dated Jul. 6, 2007, from Chinese Patent Application No. 03803196.5 (filed Feb. 14, 2003), 6 pages (translated).

Response to Office Action dated Sep. 4, 2007, from Chinese Patent Application No. 03803196.5 (filed Feb. 14, 2003), 3 pages.

International Business Machines, "Non Mechanical Probed Test Element Group (TEG)", Research Disclosure, Mason Publications, Hampshire, GB, vol. 425, No. 76, Sep. 1999, XP007124822, ISSN: 0374-4353.

Invitation to Pay Additional Fees, International Patent Application No. PCT/US03/03494, Applied Materials, Inc., Sep. 12, 2005.

Yamada, et al., An In Line Process Monitoring Method Using Electron Beam Induced Substrate Current, Microelectronics-Reliability, Mar. 2001, pp. 455-459.

Yamada, et al., An In-Line Contact and Via Hole Inspection Method Using Electron Beam Compensation Current, IEEE, 1999.

* cited by examiner

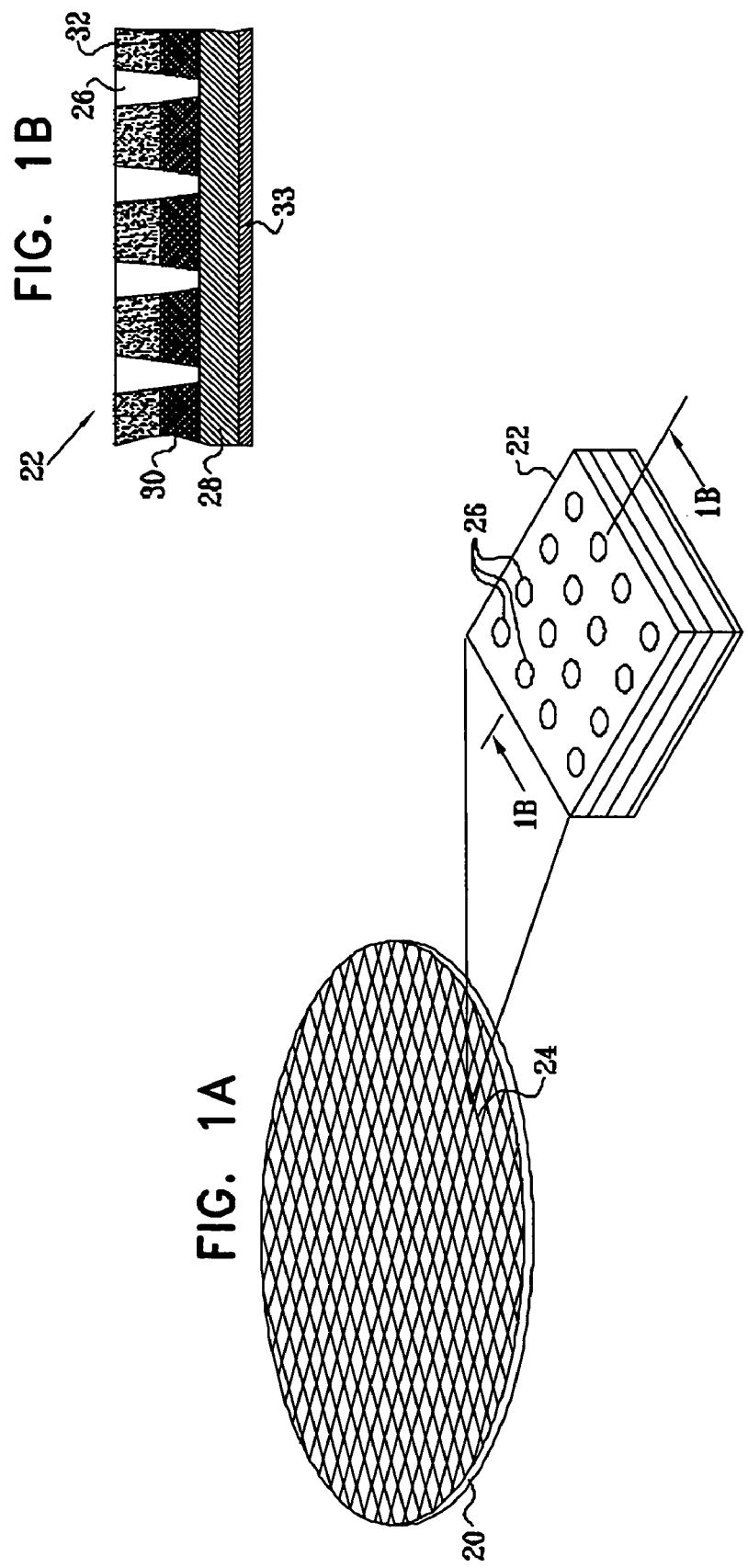

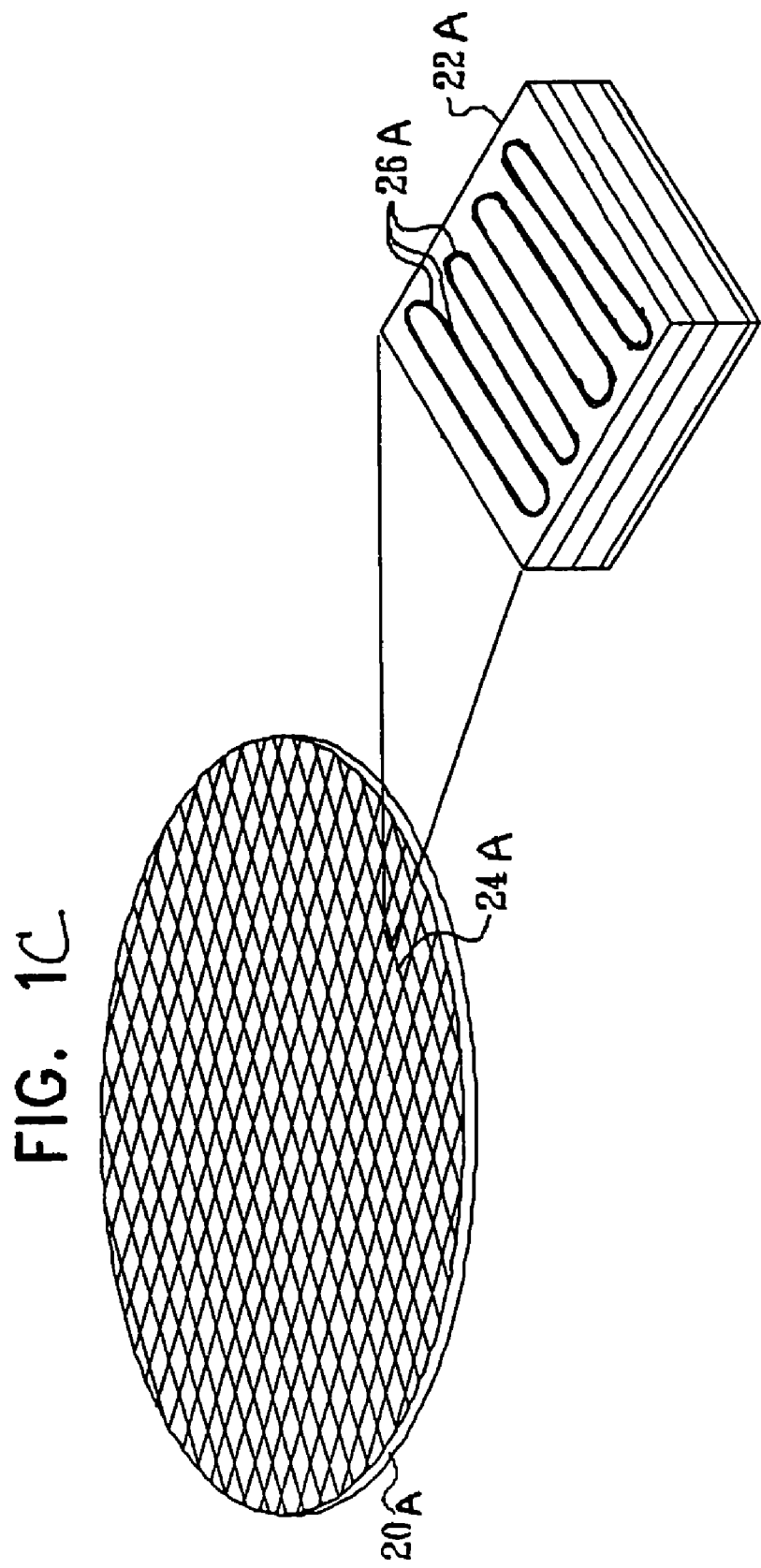

SPECIMEN CURRENT MAPPER

CROSS-REFERENCE TO RELATED APPLICATIONS

This application is a continuation in part of allowed U.S. patent application Ser. No. 10/434,977, filed 9 May 2003, now U.S. Pat. No. 7,038,224, which is a continuation in part of U.S. patent application Ser. No 10/209,087filed 30 Jul. 2002 now U.S. Pat. No. 7,078,690. The disclosures of these related applications are incorporated herein by reference.

FIELD OF THE INVENTION

The present invention relates generally to semiconductor device manufacturing and process control, and specifically to monitoring of process quality and uniformity.

BACKGROUND OF THE INVENTION

Contact hole production is a common step in semiconductor device manufacturing. The contact holes are typically used to make electrical connections to a semiconductor or metal layer through an overlying non-conducting (dielectric) layer, such as an oxide layer. In order to produce contact holes, a layer of photoresist is first deposited on the wafer surface. The photoresist is exposed to patterned visible or ultraviolet radiation, hardened, and developed in order to form a "mask" over the wafer, with mask patterns corresponding to contact hole locations. Then the wafer is transferred to an etch station where contact holes are formed through the dielectric layer, down to the underlying semiconductor or metallic layer. The photoresist mask is then removed, and the contact holes are filled with metal. A similar masking and etching process is used in producing trenches or vias in the wafer surface.

In order to ensure consistent device performance, the depth, width, and bottom surface of contact openings must be carefully controlled at various locations across the wafer surface. (In the context of the present patent application and in the claims, the term "contact openings" refers to all structures of the type described above, including contact holes, vias, and trenches.) Deviations in the dimensions of contact openings at a location on the wafer or across the wafer surface can lead to variations in the contact resistance. If these variations are too large, they impact on device performance and can lead to loss of process yield. The manufacturing process must therefore be carefully monitored and controlled, not only in order to detect deviations in formation of contact openings on individual devices, but also to monitor non-uniformities across the wafer surface. Early detection of process non-uniformity allows the device manufacturer to take corrective action, so as to ensure uniformly high yields and avoid the loss of costly wafers in process.

Various methods for contact hole inspection are known in the art. One such method is described by Yamada et al., in "An In-Line Process Monitoring Method Using Electron Beam Induced Substrate Current," in *Microelectronics-Reliability* 41:3 (March 2001), pages 455-459, which is incorporated herein by reference. The compensation current in an electron beam system, also known as the specimen current, is defined as the absorbed current that flows from the primary electron beam to earth via the specimen (i.e., via the wafer). In other words, the specimen current is equal to the difference between the primary beam current and the total electron yield of the specimen due to secondary and backscattered electrons. The specimen current can be either positive or negative, depending on whether the energy of the primary electron beam is in the positive-or negative-charging domain of the specimen. Yamada et al. directed an electron beam at single holes and groups of holes in a silicon oxide surface layer overlying a silicon substrate, and measured the resultant compensation current. They found that the compensation current was a good indicator of hole-bottom oxide thickness, as well as of the hole diameter.

Yamada et al. describe further aspects of contact hole measurement in U.S. patent application Publication No. US 2002/0070738 A1, whose disclosure is incorporated herein by reference. Semiconductor devices are inspected by measuring the specimen current in an area of a sample having no contact holes as a background value, and comparing this value to the current measured in the area of a hole. The current waveform is automatically evaluated in order to determine whether the measurement is indicative of a defect of the device or of manufacturing equipment used in producing the device.

In U.S. Pat. No. 6,559,662, whose disclosure is incorporated herein by reference, Yamada et al. describe a semiconductor device tester based on specimen current measurement. A plurality of measuring positions on a sample are sequentially irradiated with electron beams having identical shapes. The currents produced in the sample due to irradiation at the individual measuring positions are measured, and the measurements are displayed on a two-dimensional plane as a function of measuring position.

SUMMARY OF THE INVENTION

It is an object of some aspects of the present invention to provide improved methods and systems for monitoring production of contact openings.

In embodiments of the present invention, contact openings on a sample, typically a semiconductor wafer, are irradiated at multiple locations with a focused beam of charged particles, along a beam axis that deviates substantially in angle from a normal to the surface of the sample. At each location, the specimen current is measured and recorded, along with coordinate information. The specimen current measurements over the entire sample, or a region of the sample, are mapped in graphical or in numerical form. The map facilitates detection of deviations of the measured specimen current from benchmark values and of process non-uniformities over the sample that cause uneven etching of the contact openings.

The measured specimen current at each location serves as a quantitative measure of the quality of contact openings at the location. Specimen current magnitude can serve as a measure of the thickness of the residue on the bottom of a contact opening. Typically, a high absolute value of the specimen current indicates good contact to ground, while low absolute value indicates higher resistance to ground. The use of an angled beam of charged particles to irradiate the sample provides enhanced sensitivity to thin residue layers that may remain at the bottom of contact openings. The combination of angling the beam and mapping the resultant specimen current thus provides a particularly sensitive, integrated picture of the accuracy and uniformity of the process that is used to create the contact openings.

The specimen current measurements described hereinabove may be made before a photoresist mask used in etching the contact openings is removed from the wafer. If the specimen current map indicates that the contact openings have not been fully etched for all or a part of the wafer, the etching process can be adjusted and continued until the proper etch parameters are reached. Alternatively or additionally, the process variables may be adjusted to effect more precisely etched holes and/or a more uniform distribution of these etched holes across the wafer surface. Such variables include, for example, lithographic alignment, photoresist application, stop layer thickness, and material deposition thickness.

There is therefore provided, in accordance with an embodiment of the present invention, a method for process monitoring, including:

receiving a sample having a first layer that is at least partly conductive and a second layer formed over the first layer, following production of contact openings in the second layer;

directing a beam of charged particles along a beam axis that deviates substantially in angle from a normal to a surface of the sample, so as to irradiate one or more of the contact openings in each of a plurality of locations distributed over at least a region of the sample;

measuring a specimen current flowing through the first layer in response to irradiation of the one or more of the contact openings at each of the plurality of locations; and creating a map of at least the region of the sample indicating the specimen current measured in response to the irradiation at the plurality of the locations.

The method may also include measuring a secondary electron current emitted from the sample responsive to the beam of charged particles, and creating the map may include mapping the secondary electron current together with the specimen current.

In a disclosed embodiment, the method includes directing the beam of charged particles toward one or more reference locations that are adjacent to at least one of the plurality of locations of the irradiated contact openings, and measuring the specimen current includes measuring reference values of the specimen current in response to the irradiation of the reference locations, and creating the map includes subtracting the reference values from the specimen current measured in response to the irradiation of the contact openings to generate subtracted current values, and using the subtracted current values in creating the map.

Typically, creating the map includes assessing, based on the map, at least one of a characteristic depth and a characteristic width of the contact openings at each of the plurality of locations. Additionally or alternatively, creating the map includes assessing, based on the map, non-uniformities in a process used to create the contact openings. Assessing the non-uniformities may include assessing variations over the region of the sample, as well as assessing variations between different, first and second samples. The method may further include applying corrective action to the process responsively to the map.

In a disclosed embodiment, the sample includes a semiconductor wafer, and at least some of the locations are located on different dies of the wafer. Typically, directing the beam of charged particles includes selecting the locations to irradiate such that the one or more of the contact openings in each location among the plurality of locations are characteristic of the contact openings in a respective area of the location. Further typically, at least one of the contact openings is a contact hole or a trench.

In one embodiment, the contact openings have side walls and a bottom, and directing the beam of charged particles includes angling the beam so that more of the charged particles strike the side walls than strike the bottom.

Typically, creating the map includes assessing, based on the map, whether a contaminant residue is present within the contact openings.

In another embodiment, the method includes negatively precharging the surface of the sample in proximity the contact openings, so as to facilitate measurement of the specimen current.

There is also provided, in accordance with an embodiment of the present invention, apparatus for testing a sample having a first layer that is at least partly conductive and a second layer formed over the first layer, following production of contact openings in the second layer, the apparatus including:

a particle beam source adapted to direct a beam of charged particles along a beam axis that deviates substantially in angle from a normal to a surface of the sample, so as to irradiate one or more of the contact openings in each of a plurality of locations distributed over at least a region of the sample;

a current measuring device adapted to measure a specimen current flowing through the first layer in response to irradiation of the one or more of the contact openings at each of the plurality of locations; and a controller adapted to create a map of at least the region of the sample indicating the specimen current measured in response to the irradiation at the plurality of locations.

There is additionally provided, in accordance with an embodiment of the present invention, a method for process monitoring, including:

receiving a sample having a first layer that is at least partly conductive and a second layer formed over the first layer, following production of a structure in the first layer and contact openings in the second layer;

directing a beam of charged particles to irradiate one or more of the contact openings in each of a plurality of locations distributed over at least a region of the sample;

measuring a specimen current flowing through the first layer in response to irradiation of the one or more of the contact openings at each of the plurality of locations; and assessing an alignment between the contact openings in the second layer and a structure in the first layer at each of the plurality of locations responsively to the measured specimen current.

Typically, assessing the alignment includes creating a map of at least the region of the sample indicative of the alignment.

There is further provided, in accordance with an embodiment of the present invention, apparatus for testing a sample having a first layer that is at least partly conductive and a second layer formed over the first layer, following production of a structure in the first layer and contact openings in the second layer, the apparatus including:

a particle beam source adapted to direct a beam of charged particles so as to irradiate one or more of the contact openings in each of a plurality of locations distributed over at least a region of the sample;

a current measuring device adapted to measure a specimen current flowing through the first layer in response to irradiation of the one or more of the contact openings at each of the plurality of locations; and a controller adapted to assess an alignment between the contact openings in the second layer and a structure in the first layer at each of the plurality of locations responsively to the measured specimen current.

The present invention will be more fully understood from the following detailed description of the preferred embodiments thereof, taken together with the drawings in which:

BRIEF DESCRIPTION OF THE DRAWINGS

FIG. 1A is a schematic top view of a semiconductor wafer with a pattern of contact holes formed thereon, in accordance with an embodiment of the present invention;

FIG. 1B is a schematic, sectional view of the pattern of FIG. 1A, taken along a line 1B-1B;

FIG. 1C is a schematic top view of a semiconductor wafer with a pattern of trenches formed thereon, in accordance with an embodiment of the present invention;

DETAILED DESCRIPTION OF EMBODIMENTS

Figure 2A:
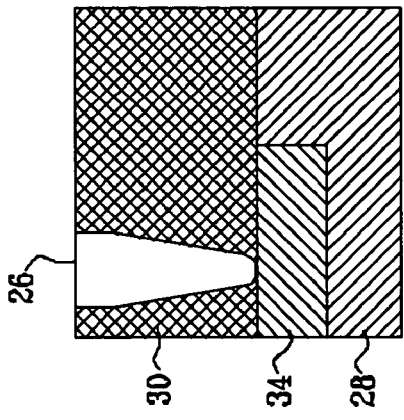
FIGS. 2A-2E are schematic, sectional illustrations of an area of a semiconductor wafer, showing a contact hole etched into the wafer under different process conditions.

Reference is now made to FIGS. 1A and 1B, which schematically illustrate a semiconductor wafer 20 and details of a pattern 22 of contact holes 26 formed thereon, in accordance with an embodiment of the present invention. FIG. 1A is a top view of the wafer, with the pattern shown enlarged in an inset. FIG. 1B is an enlarged, cross-sectional view of the pattern, taken along line 1B-1B in FIG. 1A. Pattern 22 may be a dedicated test pattern, for use in specimen current mapping, as described below, or it may compnse a group of production contact holes in a known location on wafer 20. (Exemplary test patterns are described in the above-mentioned U.S. patent application Ser. No. 10/209,087.) Although only the single pattern 22 is shown in FIG. 1A by way of example, multiple patterns of this sort, distributed over the surface of wafer 20, are used in specimen current mapping. The pattern may also include other types of contact openings, such as trenches or vias. A pattern 22A of trenches 26A is illustrated in FIG. 1C. Alternatively, specimen current measurements may be made and mapped on individual contact holes.

In a typical application, a dielectric oxide layer 30 is formed over a conductive or semiconductor underlying layer 28, and a layer of photoresist 32 is deposited on the dielectric layer. Layer 28 may comprise the silicon substrate of the wafer, or it may comprise an intermediate semiconductor or metal layer used as a part of devices fabricated on the substrate. Holes 26 are defined by photolithography, and are then etched through layer 30 down to underlying layer 28. A measurement of the specimen current generated when pattern 22 is irradiated by an electron beam is indicative of the extent to which layer 28 is exposed within the holes. To facilitate specimen current measurement, a conductive contact pad 33 may be formed on the underside of wafer 20, below pattern 22.

FIGS. 2A-2E are schematic, sectional illustrations of an area of a semiconductor wafer, showing formation of hole 26 under different process conditions. In the exemplary application shown in these figures, hole 26 is meant to provide a contact to a region 34 of substrate layer 28 that contains $TiSi_2$ for enhanced conductivity. Region 34 is typically part of a gate structure, formed within layer 28 by methods known in the art. Oxide layer 30 typically comprises materials such as undoped silicon glass (USG) or boron phosphorus silicon glass (BPSG) or low-k dielectrics, with the possible addition of a nitride barrier layer (for example, $Si_3N_4$, not shown) between the silicon substrate and the glass. The structure illustrated in these figures, however, is shown solely by way of example, and holes 26 may similarly be made in and adjacent to other structures.

Figure 2B:
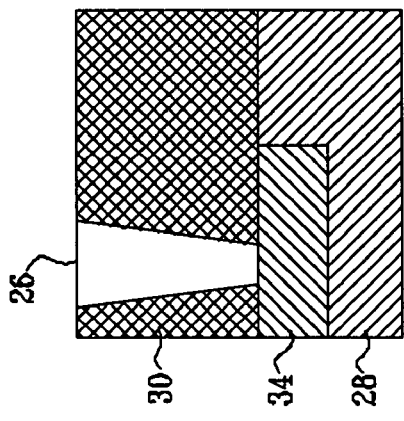

FIG. 2A shows an ideally-etched, open hole, i.e., a contact hole that cleanly exposes region 34, as desired. The remaining figures in this figure set show the results of different process anomalies. In FIG. 2B, hole 26 is underetched, typically due to a problem in the etching process or in the uniformity of layer 30, for example. Consequently, the area of region 34 that is exposed at the base of hole 26 is smaller than desired. As a result, the specimen current generated when hole 26 is irradiated by an electron beam is smaller than the benchmark current generated for the ideally-etched hole shown in FIG. 2A. When the underetched hole is filled with metal in order to contact region 34, the contact resistance may be higher than desired.

Figure 2C:
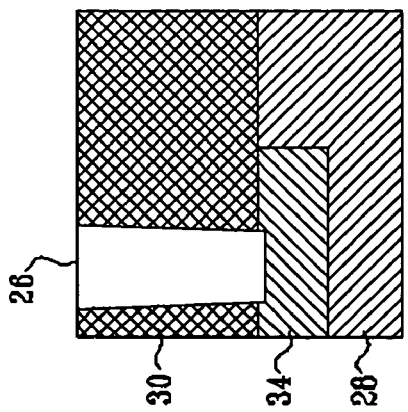

In FIG. 2C, the etching process is too strong or has continued for too much time, leading to overetching of hole 26. In this case, the specimen current will typically be greater than in the case of FIG. 2A. Overetching may have a deleterious effect on region 34 and on other structures, and may also lead to the deposition of contaminants at the base of hole 26. In this case, the specimen current will be smaller.

Figure 2D:
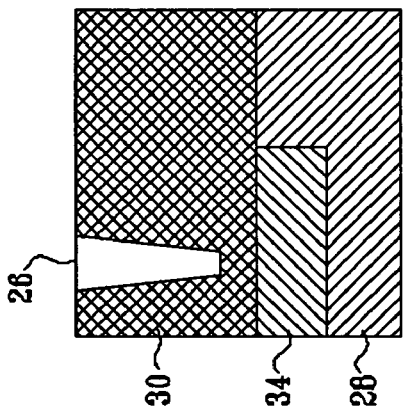

FIG. 2D shows underetching, in which hole 26 stops short of reaching region 34, typically due to an incorrect etching process or an insufficient etching time. The measured specimen current for hole 26 in the present figure is low, and the subsequent contact resistance, following metal fill, may be substantially higher than desired.

Figure 2E:
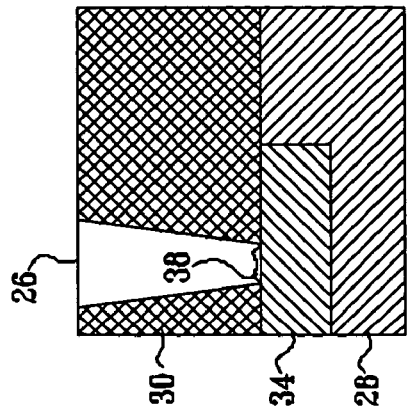

Finally, in FIG. 2E, hole 26 is properly etched. However, a contaminant 38, such as photoresist polymer residue or dielectric residue, is deposited at the base of the hole. This contaminant typically causes a decrease in the measured specimen current as compared with the measured specimen current of an ideally etched hole, and the contaminant may cause a high contact resistance following metal fill.

In general, when a wafer is irradiated with an electron beam, and this process reaches equilibrium, the relationship between the specimen current ($I_{specimen}$), the primary current (i.e. the current of the irradiating electron beam—$I_{primary}$), and the current of secondary electrons emitted from the wafer, including scattered electrons ($I_{secondary}$), is expressed by the following equation, as is known in the art.

$$I_{primary} = I_{secondary} + I_{specimen} \tag{1}$$

When specimen current is measured, the surface of the wafer may be biased with a negative precharge, as described in the above-mentioned U.S. patent application Ser. No. 10/434, 977. One effect of this precharge is to keep a large portion of the secondary electrons generated within the contact openings from leaving the wafer surface, thereby reducing $I_{secondary}$ and increasing $I_{specimen}$.

Referring to FIG. 2D, the sensitivity of measured $I_{specimen}$ to the thickness of residual dielectric material in layer 30 between the base of hole 26 and region 34 is related to the difference in the secondary electron (SE) yield and to the difference in conductivity between the materials of layer 30 and of region 34. Typically, the secondary electron yield of dielectric materials is about twice the yield of semiconductor or conducting materials, for low electron beam energies, typically <1 kV. On the other hand, because of the low conductivity of the dielectric material in layer 30, the measured $I_{specimen}$ is roughly inversely proportional to the residual dielectric thickness for contact holes that are slightly underetched, and is close to zero for substantially underetched holes. Therefore, for a given contact hole or group of contact holes in a known location on a wafer die, the measured $I_{specimen}$ is a sensitive indicator of dielectric residual thickness in the approximate range of 0 to several tenths of nanometers. Furthermore, the measured $I_{specimen}$ at the same location on different dies should be consistent over the entire wafer, and differences in the measured values may be indicative of process non-uniformities. These non-uniformities and other process defects may be detected using the methods of specimen current mapping described hereinbelow.

Figure 3A:
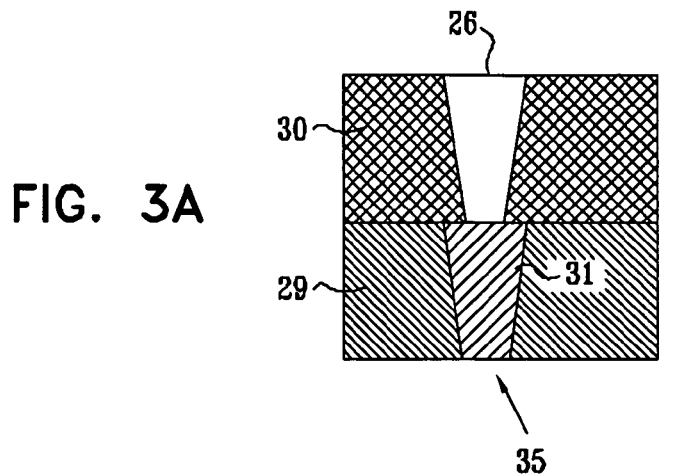
FIG. 3A is a schematic sectional illustration of an area of a semiconductor wafer, showing alignment between contact holes in different layers formed on the wafer.
Figure 3B:
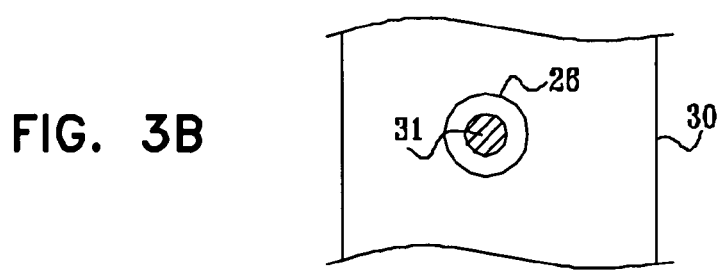
FIG. 3B is a schematic top view of the area shown in FIG. 3A.
Figure 3C:
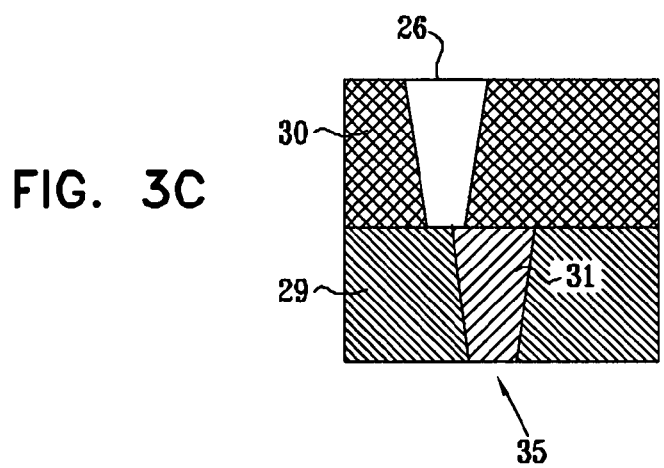
FIG. 3C is a schematic sectional illustration of an area of a semiconductor wafer, showing misalignment between contact holes in different layers formed on the wafer.
Figure 3D:
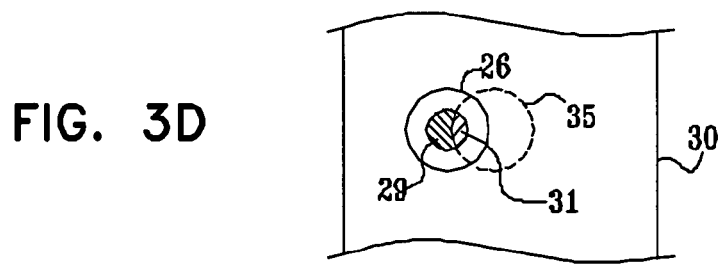
FIG. 3D is a schematic top view of the area shown in FIG. 3C.

Reference is now made to FIGS. 3A-3D, which schematically illustrate another application of the methods of specimen current mapping provided by the present invention. FIGS. 3A and 3C, which are sectional illustrations of areas of a semiconductor wafer, showing well-formed holes 26, which are in proper alignment (FIG. 3A) or misalignment (FIG. 3B) with underlying contact holes 32. (This type of misalignment is also known as overlay misregistration.) FIGS. 3B and 3D are schematic top views of the respective areas shown in FIGS. 3A and 3C. In the exemplary application shown in these figures, hole 26 is meant to line up with underlying hole 32, which is filled with a metal 31, such as tungsten. (Hole 32 is assumed to have been formed in an underlying layer 29 in a previous processing step.)

The alignment or misalignment of holes 26 and 32 may be detected by directing an electron beam toward hole 26 and measuring $I_{specimen}$ values. When an acceptably etched and correctly aligned hole is formed, as shown in FIGS. 3A and 3B, fill metal 31 completely fills the view of the bottom of hole 26. Therefore, when an electron beam is directed to irradiate the area of hole 26, a relatively high value of $I_{specimen}$ is measured. On the other hand, when hole 26 is incorrectly aligned with hole 32, as shown in FIGS. 3C and 3D, the view of the bottom of hole 26 is filled partly by fill metal 31 and partly by the material of layer 29 (which may be dielectric or semiconductor material). When $I_{specimen}$ is measured in this misaligned configuration, its value is typically less than that for the correctly aligned holes of FIGS. 3A and 3B.

The variation in the value of $I_{specimen}$ in the two examples above provides an indication of photolithographic misalignment, which may have occurred at various magnitudes over the entire wafer, or in a certain area or areas of the wafer. By mapping $I_{specimen}$ over the wafer surface, the magnitude, nature, and cause of the misalignment may be deduced. A lithography station that was used in producing the contact holes in the wafer may be adjusted, based on the map, in order to prevent or minimize the misalignment in wafers produced subsequently. Note that the hole configuration of FIGS. 3A-3D is shown here solely by way of example, and the method exemplified by this figures may similarly be applied to evaluate the alignment of other types of contact openings, as well.

Figure 4A:
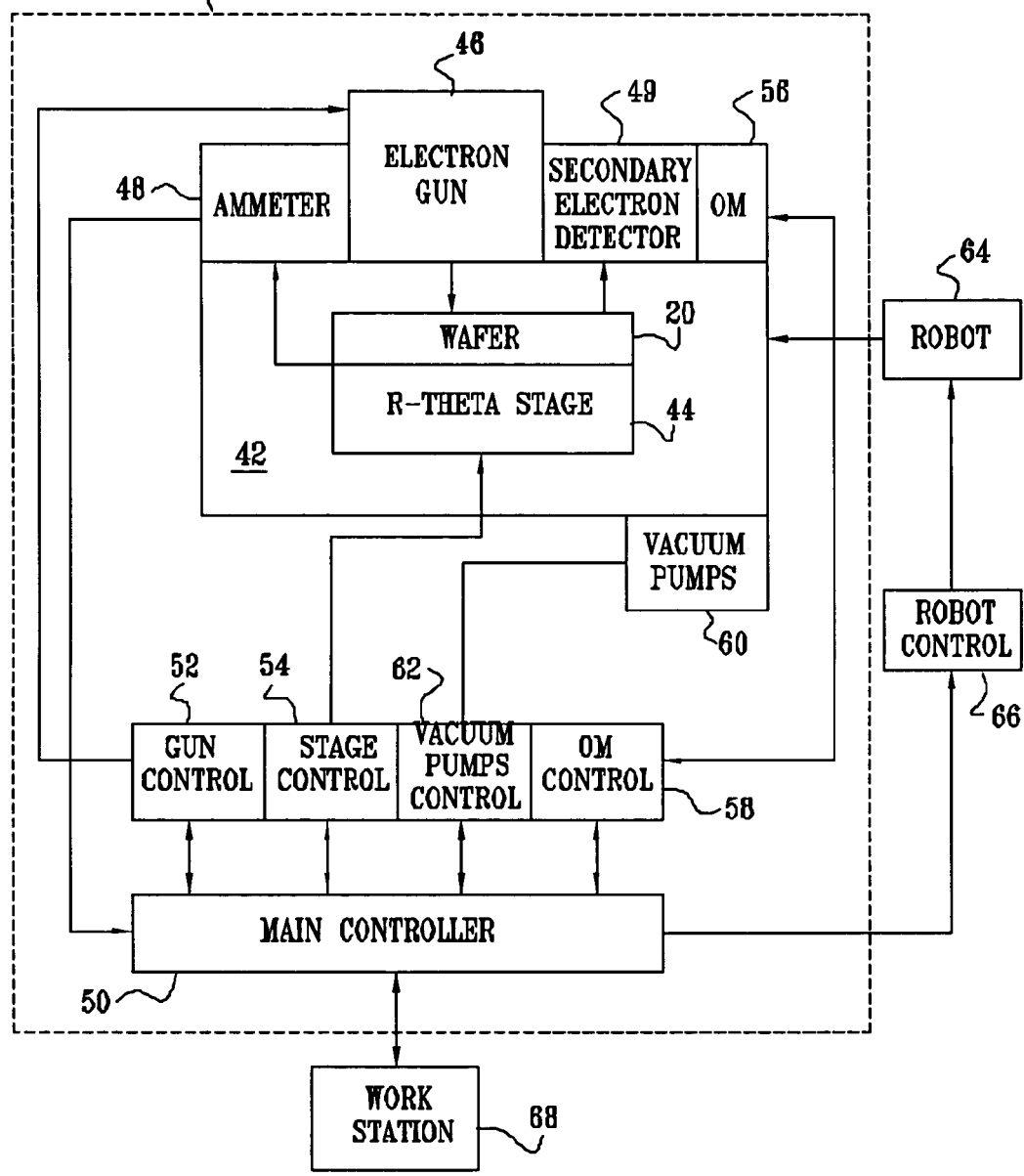
FIG. 4A is a block diagram that schematically illustrates apparatus for contact hole inspection and specimen current mapping, in accordance with an embodiment of the present invention.

Reference is now made to FIG. 4A, which is a block diagram that schematically illustrates a station 40 for contact hole inspection and specimen current mapping, in accordance with an embodiment of the present invention. Station 40 comprises a chamber 42, containing a motion stage 44 on which wafer 20 is placed during inspection. An electron gun 46 directs an electron beam at wafer 20, while an ammeter 48 measures $I_{specimen}$ generated in the wafer. The ammeter is electrically coupled to the semiconductor or conducting layer at the bottom of the contact holes of interest (such as layer 28, shown in FIG. 1B), optionally by means of contact pad 33.

The electron beam generated by gun 46 is scanned so as to irradiate multiple, different locations over a region of the wafer or over the entire wafer. The beam diameter defines the field of view (FOV) of the measurement, which may be adjusted so that at each location, the beam irradiates a single contact hole or a group of contact holes, such as two or more of the holes in pattern 22 (FIG. 1), or even all the holes in the pattern simultaneously. For this purpose, the FOV may vary between about 0.1 μm and hundreds of pm. The electron energy of the gun is typically variable, between about 100 and 5000 eV, so as to cover both positive and negative charging domains of the materials in wafer 20. (The positive charging domain is the range of electron energies in which the total yield of secondary and backscattered electrons from the surface layer is greater than 1, while the negative charging domain in the range in which the total yield is less than 1. These phenomena, which are well known in the art, are described by Yacobi et al., in Chapter 2 of *Microanalysis of Solids* (Plenum Press, New York, 1994), which is incorporated herein by reference.) A suitable electron gun for this purpose, for example, is a thermal field emitter, produced by Denka or FEI.

Stage 44 positions wafer 20 so that a given contact hole or group of contact holes at each location that is to be irradiated is properly located under the beam of gun 46. Stage 44 may comprise an x-y-theta or an R-theta (translation/rotation) stage. The contact holes thus measured may comprise special test patterns, such as pattern 22 (FIGS. 1A and 1B), or they may, alternatively or additionally, comprise functional contact holes to be used in microelectronic devices fabricated on the wafer. $I_{specimen}$ is measured as the beam irradiates the proper locations, and a specimen current map (shown hereinbelow in FIG. 6) is created. The measurements are typically made at the same location on all the dies on the wafer. Alternatively, the measurements may be made only on certain, selected dies, or at multiple locations on some or all of the dies. The contact hole locations evaluated in this manner may be chosen for assessing etch quality, overlay misregistration, or both, or for assessing other process characteristics. The locations thus selected are typically representative of the process characteristics of the die on which they are located or of an area of the wafer containing multiple dies. If desired, a number of different types of contact openings may be chosen and evaluated.

Optionally, a reference measurement of the specimen current is performed adjacent to each contact hole (or group of contact holes) for which $I_{specimen}$ is measured, or at least adjacent to certain contact holes. The reference measurement is performed at a small distance from the contact hole measurement location, typically in an area of the die without contact holes, in which the specimen current thus measured is expected to be close to zero. The reference $I_{specimen}$ value is subtracted from the contact hole $I_{specimen}$ value, and the resultant difference specimen current value is used in the specimen current map.

Optionally, a secondary electron image is measured simultaneously using a secondary electron detector 49, as is known in the art. The positioning and operation of gun 46 and stage 44 are controlled by a main controller 50, via a gun control unit 52 and a stage control unit 54. Typically, a pre-alignment unit based on an optical microscope (OM) 56 is used by controller 50, via an OM control unit 58, to locate the pattern on the wafer for positioning and alignment purposes. Suitable microscopes for this purpose are made, for example, by Optem (Fairport, N.Y.). During operation, a vacuum is maintained in chamber 42 by a vacuum pump 60, which is also controlled and monitored by controller 50, via a vacuum control unit 62. A robot 64 inserts wafers into chamber 42 and removes them from the chamber. Controller 50 communicates with the robot via a robot control unit 66. Robot 64 is preferably used to transfer wafers to and from other stations in a cluster tool (not shown).

Figure 6:
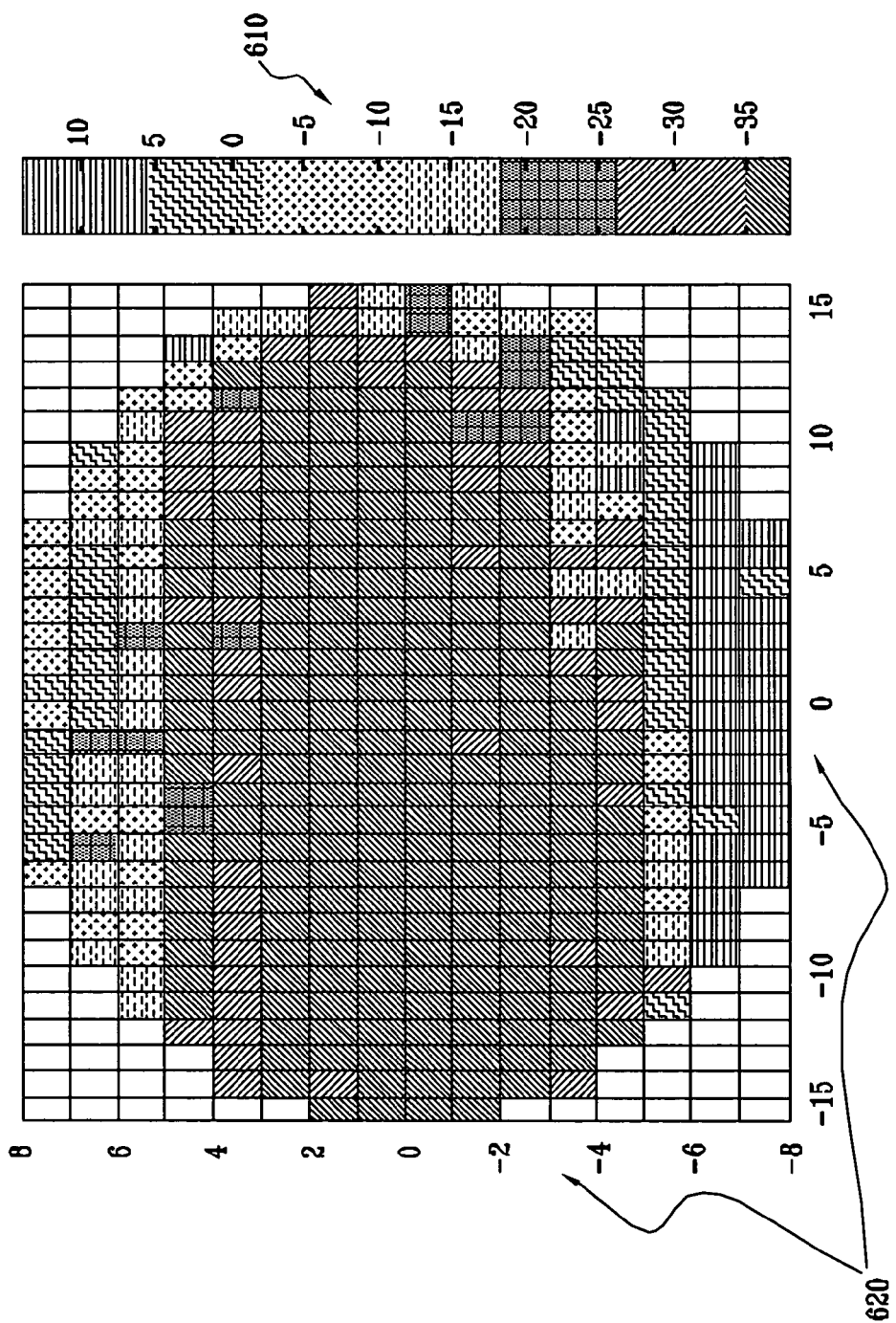
FIG. 6 is a schematic representation of a specimen current map indicating specimen current measurements at locations across a wafer, in accordance with an embodiment of the present invention.

After positioning stage 44 and firing gun 46 to irradiate the selected contact holes and, optionally, reference areas, controller 50 receives the $I_{specimen}$ values measured by ammeter 48. The controller uses these values in preparing a specimen current map, which is typically displayed on a user workstation 68. An exemplary map is shown in FIG. 6. Test results are evaluated and whatever corrective action may be necessary is implemented. The evaluation typically compares the measured specimen current values to benchmark values that have been established for the expected hole size, materials, etch conditions and other applicable process parameters, as well as comparing the specimen current values that have been measured on different dies across the wafer. Wafer-to-wafer comparisons of specimen current maps may also be made. The corrective action may include performing further etching, if the contact holes are underetched (as shown in FIG. 2B or 2D), or removing polymer residue that may have been deposited at the bottoms of the holes (as shown in FIG. 2E). Additionally or alternatively, the corrective action may include process and alignment adjustments to the photolithography station and/or etching equipment that was used in producing the wafer currently measured.

Figure 4B:
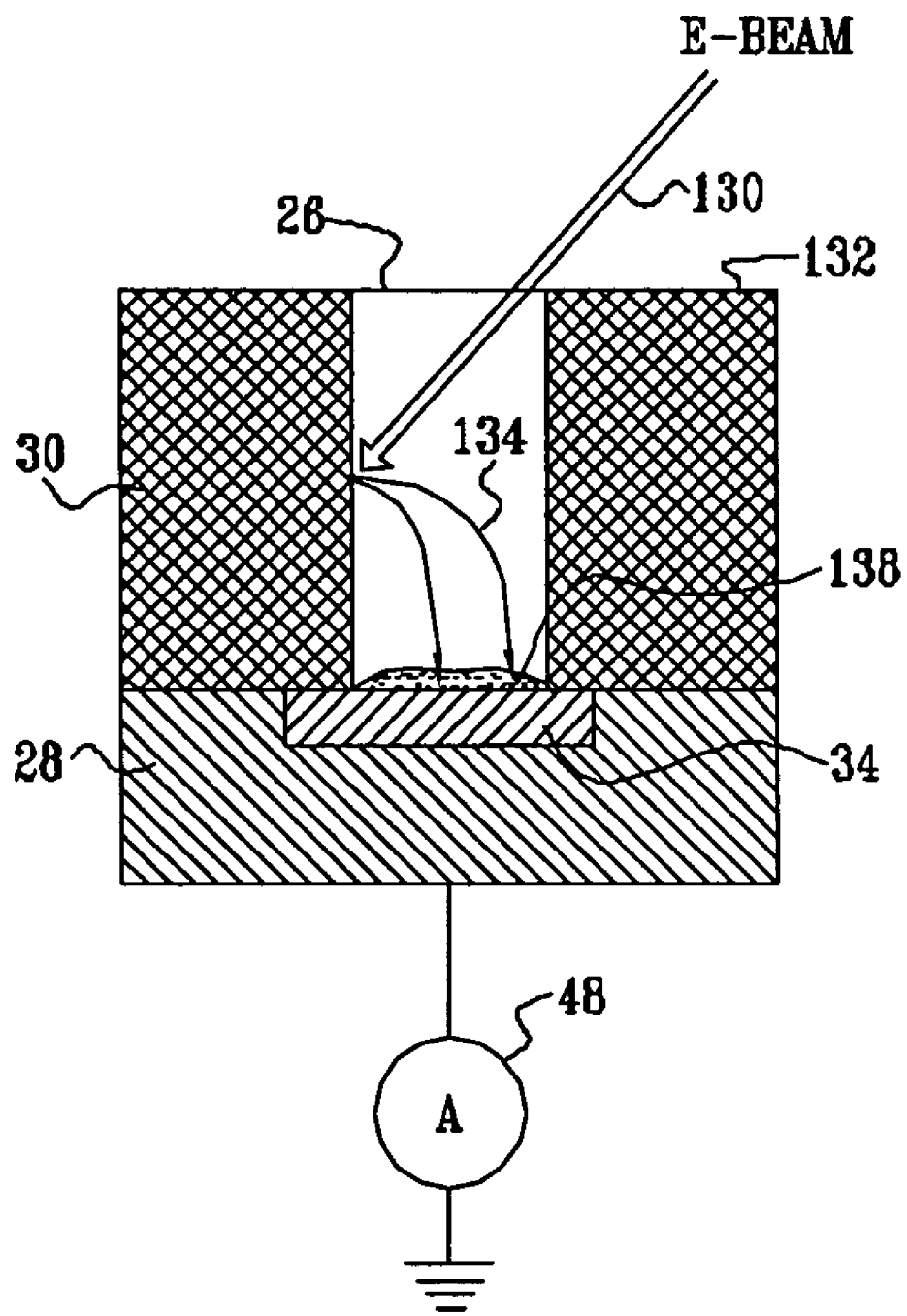
FIG. 4B is a schematic, sectional view of a contact hole on which an electron beam is incident at a non-normal angle, in accordance with an embodiment of the present invention.

FIG. 4B is a schematic, sectional illustration showing angled irradiation of contact hole 26 by an electron beam 130, in accordance with an embodiment of the present invention. Tilting of electron beam 130 may be achieved by either mechanical means or by the use of electron optics to control the beam, or by a combination of both techniques. Some CD SEM systems, such as the Applied Materials NanoSEM3D, provide this sort of beam tilt capability. Because the electron beam is tilted, the primary beam electrons typically pass at an angle through any residual dielectric layer or a contaminant 138 that may remain at the bottom of the contact hole. As a result, the path of the electrons through the residual layer or contaminant is longer, and the electrons are more likely to interact with the residual layer or contaminant. Therefore, the sensitivity of the specimen current measurement to thin residual dielectric layers and contaminants in the contact holes is enhanced.

Furthermore, the tilt angle of beam 130 may be chosen so that a majority of primary beam electrons do not strike the bottom of the contact hole. This condition can be achieved when the following geometrical condition is satisfied:

$$\alpha > \arctan(1/AR),$$

wherein α is the tilt angle, and AR is the aspect ratio (ratio of depth to diameter) of the contact hole. As a result of this tilt angle, the primary electrons hit the side wall of the hole 26 rather than the bottom. The electron bombardment causes emission of secondary electrons with low energy (typically <50 eV). The low-energy secondary electrons can be forced down to the hole bottom, rather than moving out of the hole, by negatively precharging a surface 132 of the wafer around the hole. (Such precharging may be accomplished, for example, by operating the electron beam at an energy in the negative charging domain of surface 132 before making the specimen current measurement.) If the contact hole is etched properly (with no residue left at the bottom), the low-energy electron flow will pass through substrate 28 and will thus be measured as a specimen current by ammeter 48. If a thin residue (even tens of Angstroms thick), such as under-etched dielectric or contaminant 138, is left after the etch, the specimen current will be much lower, due to low penetration depth of the low-energy secondary electrons.

By contrast, when electron beam 130 operates at higher energy and is not angled, the energetic primary electrons reach the bottom of hole 26. In this case, the primary electrons pass easily through contaminant 138. Therefore, holes with particularly thin residues cannot be readily distinguished from holes that have been etched satisfactorily. Angling electron beam 130 substantially enhances sensitivity of the specimen current measurement to very thin residues at the hole bottom. This method is particularly useful in detecting fluorocarbon polymer residue, organic photoresist residue, and extremely thin oxide, nitride or other dielectric residue (including low-k dielectric with a corresponding stop layer). It can be performed by station 40 in-line, providing closed-loop monitoring of reactive ion (plasma) etching, photoresist ashing, and wet polymer cleaning steps.

Figure 5:
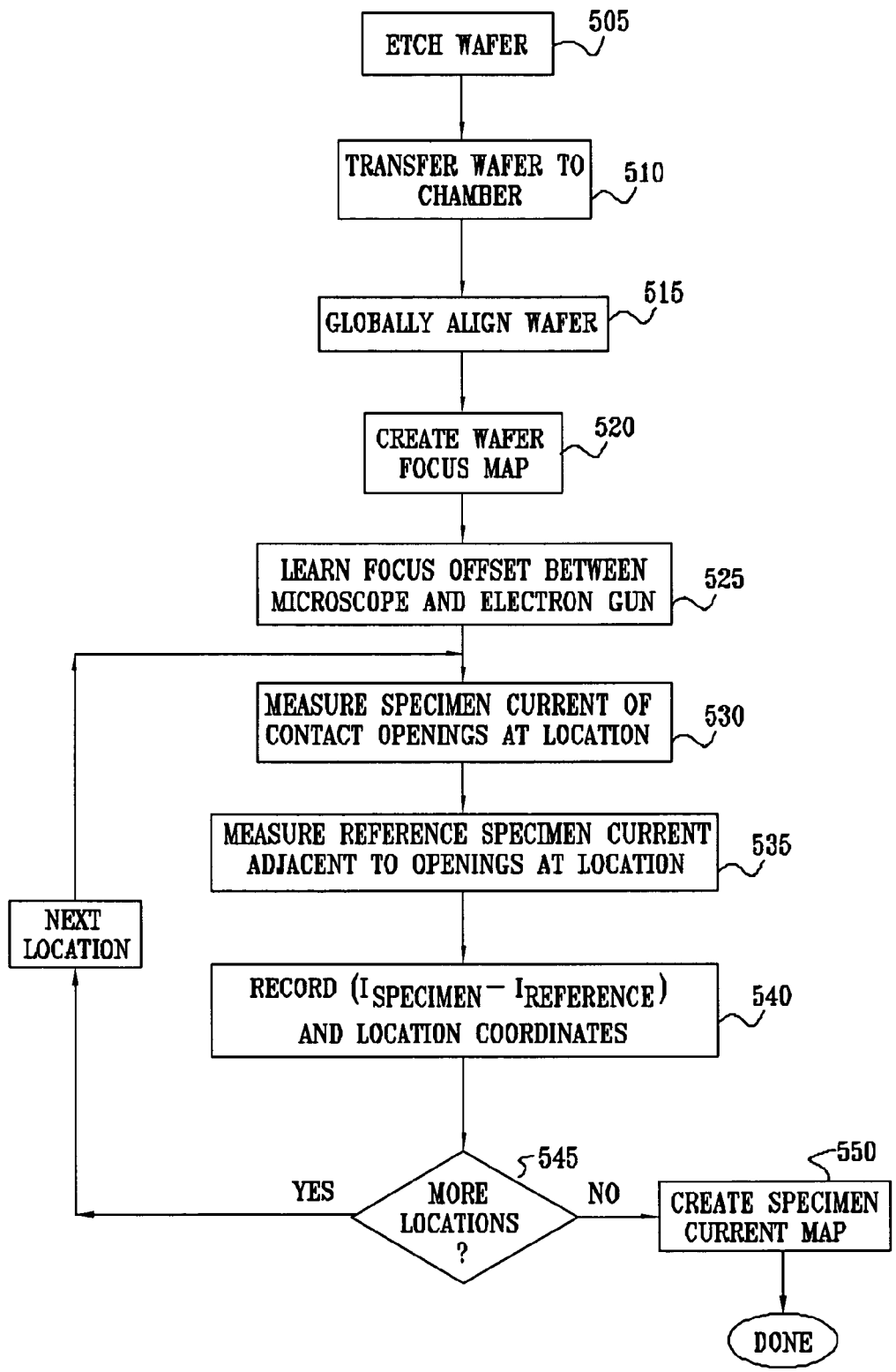
FIG. 5 is a flow chart that schematically illustrates a method for specimen current mapping, in accordance with an embodiment of the present invention.

FIG. 5 is a flow chart that schematically illustrates a method for specimen current mapping, in accordance with an embodiment of the present invention. As described above, wafer 20 is first etched to produce holes 26, at an etching step 505, and the wafer is then transferred to chamber 42 of station 40, at a transfer step 510. Stage 44 is operated to correct for any positioning offset and to align the scribe lines on wafer 20 substantially parallel to the translational movement of stage 44, in a global alignment step 515. Stage 44 is then operated to allow focusing measurements to be made by OM 56 across the surface of wafer 20, thereby creating a map of height variations across the wafer surface, at a create focus map step 520. (The focus map is used by the main controller 50 and the gun control unit 52 to control and predict focus current for electron gun 46 at each measurement location on the wafer.) Alternatively, other methods known in the art may be used to control the beam focus, without the use of a focus map. The difference in optical and electron beam focal planes, also known as focal offset, is determined in a learn focus offset step 525. This is done by comparing the focal length that is measured by the OM to the focal length measured by the SEM. The focus offset is the difference between the two measurements.

Based on preselected measurement locations of one or more contact openings in locations across wafer 20, the wafer is positioned at a location, gun 46 is fired, and a specimen current measurement is made, at a sample measurement step 530. The current is recorded while scanning the electron beam over a field of view that is typically a few microns across (for example, 3 microns). Alternatively, the field of view may be larger or smaller, depending on the number of contact holes to be irradiated at each location, as described above. The bandwidth of ammeter 48 may be much lower than the bandwidth of the scan, so that it records an average, quasi-DC current flowing from the scanned field of view to the ground.

A reference measurement may be performed adjacent to the contact opening or openings at the present location, as described hereinabove, in a reference measurement step 535. The reference current value ($I_{reference}$) measured in step 535 is subtracted from the specimen current value ($I_{specimen}$) measured in step 535, and the resultant current value and location coordinates are recorded, in a result recording step 540. Alternatively, $I_{reference}$ is not measured and step 540 is not performed. In this case, $I_{specimen}$ and location coordinates are recorded in step 540.

A check is performed to determine whether there are additional locations at which one or more contact openings are to be measured, at program checking step 545. If so, the controller selects the next location, repositions the wafer and measures accordingly, at step 530. Steps 530-545 are repeated until there are no further locations to measure. The data recorded at step 535 are used to create a specimen current map (shown hereinbelow in FIG. 6), at a mapping step 550.

FIG. 6 is a schematic representation of a specimen current map 600, showing the specimen current measured at multiple locations across wafer 20, in accordance with an embodiment of the present invention. A key 610 shows a range of specimen currents versus shading gradations. (Typically, key 610 shows color shading.) Axes 620 represent dies or other convenient coordinate location indicators. Corresponding specimen currents are indicated with appropriate shading at respective locations on the map. In map 600, one specimen current value is shown for each wafer die. Alternatively, more or fewer specimen current values may be shown on map 600. Although map 600 is shown as a graphic representation, it may be alternately or additionally maintained as a numerical representation, such as in vectorial form.

As shown in map 600, the magnitude of the specimen current across most of the dies on the wafer was high (i.e., strongly negative). On the upper and lower edges of the wafer, however, much lower specimen current magnitude was measured. It is noted that this is not necessarily so and higher specimen current magnitudes can be measured on the upper and lower edges of the wafer. These low values may be indicative, for example, of non-uniformity in the etch process or of contact misalignment. The form of map 600 typically gives an indication of the type of process defect involved, so that appropriate corrective steps can be taken.

Although the embodiments described hereinabove are directed particularly to contact hole monitoring, the principles of the present invention may also be applied to other quality control tasks. A wafer specimen current map may be useful in monitoring not only etching and lithography steps, but also deposition (including material film thicknesses), and photoresist application and uniformity. The methods of the present invention provide an indication both of the width of such features and of the thickness of layers making up the features. These methods can be adapted for use not only before metal deposition, as in the embodiments described above, but also after metal deposition to inspect contacts, interconnects and metal lines for potential disconnects, short circuits, and other defects. Test station 40 may be integrated into a cluster tool for in-line monitoring of parameters described hereinabove.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for process monitoring, comprising:
   operating a beam of charged particles directed towards a sample at energy in a negative charging domain of a second layer that is formed over an at least partially conductive first layer of the sample thereby to pre-charge the second layer of the sample, the second layer having contact openings therein and the pre-charging being in a vicinity of at least some of the contact openings;
   directing the beam of charged particles towards the sample along a beam axis that is oriented at a tilt angle from a normal to a surface of the sample, the tilt angle being greater than an arctangent of an aspect ratio of the contact openings, said aspect ratio being a ratio of a depth to a diameter of an individual one of the contact openings, so as to irradiate side walls of one or more of the contact openings, but not bottoms thereof, in each of a plurality of locations distributed over at least a region of the sample;
   creating, from measurements of (i) a specimen current flowing through the first layer in response to irradiation of the side walls of the one or more of the contact openings at each of the plurality of locations and (ii) a secondary electron current emitted from the sample responsive to the beam of charged particles, a map of at least the region of the sample indicating the specimen current measured in response to the irradiation at the plurality of the locations; and
   classifying, using the map of the specimen current, anomalies in a process used to create the contact openings.

2. The method according to claim 1, wherein creating the map comprises mapping the secondary electron current together with the specimen current.

3. The method according to claim 1, wherein classifying anomalies comprises assessing, based on the map, at least one of a characteristic depth and a characteristic width of the contact openings at each of the plurality of locations.

4. The method according to clam 1, wherein classifying anomalies comprises assessing, based on rite map, non-uniformities in the process used to create the contact openings.

5. The method according to claim 4, wherein assessing the non-uniformities comprises assessing variations over the region of the sample.

6. The method according to claim 4, wherein assessing the non-uniformities comprises assessing variations between different, first and second samples.

7. The method according to claim 4, and comprising applying corrective action to the process responsively to classifying the anomalies.

8. The method according to claim 1, wherein classifying anomalies comprises assessing, based on the map, an alignment between the contact openings in the second layer and a structure in the first layer.

9. The method according to claim 1, wherein the sample comprises a semiconductor wafer.

10. The method according to claim 9, wherein at least some of the locations are located on different dies of the wafer.

11. The method according to claim 1, wherein directing the beam of charged particles comprises selecting the locations to irradiate such that the one or more of the contact openings in each location among the plurality of locations are characteristic of the contact openings in a respective area of the location.

12. The method according to claim 1, wherein at least one of the contact openings is a contact hole.

13. The method according to claim 1, wherein at east one of the contact openings is a trench.

14. The method according to claim 1, wherein classifying anomalies comprises assessing, based on the map, whether a contaminant residue is present within the contact openings.

15. Apparatus for testing a sample comprising:
a particle beam source adapted to direct a beam of charged particles towards a sample at an energy in a negative charging domain of a second layer that is formed over an at least partially conductive first layer of the sample thereby to pre-charge the second layer of the sample, the second layer having contact openings therein and the pre-charging being in a vicinity of at least some of the contact openings, and to thereafter direct the beam of charged particles towards the sample along a beam axis that is oriented at a tilt angle from a normal to a surface of the sample, the tilt angle being greater than an arctangent of an aspect ratio of the contact openings, sad aspect ratio being a ratio of a dept to a diameter of an individual one of the contact openings, so as to irradiate side walls of one or more of the contact openings, but not bottoms thereof, in each of a plurality of locations distributed over at least a region of the sample;
a current measuring device adapted to measure a specimen current flowing through the first layer in response to irradiation of the side walls of the one or more of the contact openings at each of the plurality of locations;
a secondary electron detector adapted to measure a secondary electron current emitted from the sample responsive to the beam of charged particles;
a controller adapted ft create, from measurements of the specimen current and the secondary electron current, a map of at least the region of the sample indicating the specimen current measured in response to the irradiation at the plurality of locations; and
a workstation adapted to permit classification, using the map of the specimen current, of anomalies in a process used to create the contact openings.

16. The apparatus according to claim 15, wherein the map is indicative of at least one of a characteristic depth and a characteristic width of the contact openings at each of the plurality of locations.

17. The apparatus according to claim 15, wherein the map is indicative of non-uniformities in a process used to create the contact openings.

18. The apparatus according to claim 17, wherein the non-uniformities comprises variations over the region of the sample.

19. The apparatus according to claim 17, wherein the non-uniformities comprises variations between different, first and second samples.

20. The apparatus according to claim 17, wherein the controller is adapted to apply corrective action to the process responsively to classification of the anomalies.

21. The apparatus according to claim 15, wherein the map is indicative of an alignment between the contact openings in the second layer and a structure in the first layer.

22. The apparatus according to claim 15, wherein the sample comprises a semiconductor wafer.

23. The apparatus according to claim 22, wherein at least some of the locations are located on different dies of the wafer.

24. The apparatus according to claim 15, wherein tie locations to be irradiated are selected such that the one or more of the contact openings in each location among the plurality of locations are characteristic of the contact openings in a respective area of the location.

25. The apparatus according to claim 15, wherein at least one of the contact openings is a contact hole.

26. The apparatus according to claim 15, wherein at least one of the contact openings is a trench.

27. The apparatus according to claim 15, wherein the controller is adapted to assess, based on the specimen current, whether a contaminant residue is present within the contact openings.

* * * * *